United States Patent
Bedi et al.

(10) Patent No.: US 11,776,164 B2
(45) Date of Patent: *Oct. 3, 2023

(54) CONTENT-ADAPTIVE TILING SOLUTION VIA IMAGE SIMILARITY FOR EFFICIENT IMAGE COMPRESSION

(71) Applicant: Adobe, Inc., San Jose, CA (US)

(72) Inventors: Ajay Bedi, Hamirpur (IN); Rishu Aggarwal, Delhi (IN)

(73) Assignee: Adobe, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/145,118

(22) Filed: Dec. 22, 2022

(65) Prior Publication Data

US 2023/0126890 A1 Apr. 27, 2023

Related U.S. Application Data

(63) Continuation of application No. 17/120,175, filed on Dec. 13, 2020, now Pat. No. 11,562,508.

(51) Int. Cl.
*G06T 9/00* (2006.01)
*H03M 7/30* (2006.01)
*G06T 3/40* (2006.01)

(52) U.S. Cl.
CPC ............. *G06T 9/001* (2013.01); *G06T 3/40* (2013.01); *H03M 7/3059* (2013.01); *H03M 7/6011* (2013.01)

(58) Field of Classification Search
CPC ........ G06T 9/001; G06T 3/40; H03M 7/3059; H03M 7/6011; H03M 7/3077; H03M 7/3091; H03M 7/6029; H04N 19/94
See application file for complete search history.

(56) References Cited

U.S. PATENT DOCUMENTS

2008/0159639 A1* 7/2008 Dvir ................. H04N 19/17
  382/236
2022/0189069 A1* 6/2022 Bedi ................. G06T 9/001

FOREIGN PATENT DOCUMENTS

EP    3367626 A1 *  8/2018
EP    3367626 A1    8/2018

* cited by examiner

*Primary Examiner* — Charles T Shedrick
(74) *Attorney, Agent, or Firm* — FINCH & MALONEY PLLC

(57) ABSTRACT

Techniques are provided herein for more efficiently storing images that have a common subject, such as product images that share the same product in the image. Each image undergoes an adaptive tiling procedure to split the image into a plurality of tiles, with each tile identifying a region of the image having pixels with the same content. The tiles across multiple images can then be clustered together and those tiles having identical content are removed. Once all duplicate tiles have been removed from the set of all tiles across the images, the tiles are once again clustered based on their encoding scheme and certain encoding parameters. Tiles within each cluster are compressed using the best compression technique for the tiles in each corresponding cluster. By removing duplicative tile content between numerous images of the same subject, the total amount of data that needs to be stored is reduced.

20 Claims, 9 Drawing Sheets

CONTENT-ADAPTIVE TILING SOLUTION VIA IMAGE SIMILARITY FOR EFFICIENT IMAGE COMPRESSION

CROSS-REFERENCE TO RELATED APPLICATION

This application is a continuation of U.S. patent application Ser. No. 17/120,175 (filed 13 Dec. 2020), the entire disclosure of which is hereby incorporated by reference herein.

FIELD OF THE DISCLOSURE

This disclosure relates generally to the field of image processing and image compression, and more particularly, to techniques for more efficiently storing images having a common subject.

BACKGROUND

Product photos are an important part of e-commerce as they can provide invaluable visual information about a product to a consumer. The more and better the product photographs, the better the chance to catch eye-balls and be sold. A large number of product photos are uploaded daily on cloud servers, either by sellers/vendors or by the customers. Sellers may upload multiple product photos of very high quality to make their product look good and buyers/customers may upload product photos as feedback photos. All of these photos require a large amount of asset storage space and thus can present a huge exponential cost to companies. Several gigabytes of storage may be needed to store the photos of a single product, especially if the product is popular and yields multiple user-uploaded photos. While image compression is commonly performed to reduce the amount of storage needed, image compression alone still results in too much storage space being required. Therefore, complex and non-trivial issues associated with improving image compression techniques remain.

SUMMARY

Techniques are provided herein for more efficiently storing images that have a common subject, such as product images that share the same product in the image. The techniques leverage the fact that the same subject in each image has matching color regions. Each image received of a same subject (such as a same product) undergoes an adaptive tiling procedure to split the image into a plurality of tiles, with each tile identifying a region of the image having pixels with a same RGB color intensity. The tiles across multiple images can then be clustered together based on how close their RGB values are, and those tiles having identical RGB color values are removed. Tiles that are found to share almost the same RGB color intensity (e.g., matching at least 70% of the pixels) may be broken down into smaller tiles. Once all duplicate tiles have been removed from the set of all tiles across the images, the tiles are once again clustered based on their encoding scheme and certain encoding parameters. The tiles within each cluster are then compressed using the best compression technique for the particular encoding scheme associated with the tiles in each corresponding cluster. The compressed tiles from each cluster can be saved as a single file or as any number of files. When images are to be reconstructed, an image ID is used to identify the necessary tiles, and the content for each tile is retrieved from storage in order to piece the image back together like a jigsaw puzzle. By removing duplicative tile content between numerous images of the same subject, the total amount of data that needs to be stored is reduced. Furthermore, using image compression on clusters of tiles rather than on entire images maximizes the compression efficiency since some parts of an image may be more effectively compressed using one image compression technique while other parts of the image may be more effectively compressed using another image compression technique. Numerous variations and embodiments of the disclosed techniques will be appreciated in light of this disclosure.

Any number of non-transitory machine-readable mediums (e.g., embedded memory, on-chip memory, read only memory, random access memory, solid state drives, and any other physical storage mediums) can be used to encode instructions that, when executed by one or more processors, cause an embodiment of the techniques provided herein to be carried out, thereby allowing for robust analysis of user data that has occurred over a period of time (user journey data). Likewise, the techniques can be implemented in hardware (e.g., logic circuits such as field programmable gate array, purpose-built semiconductor, microcontroller with a number of input/output ports and embedded routines). Numerous embodiments will be apparent in light of this disclosure.

DETAILED DESCRIPTION

Figure 1A:
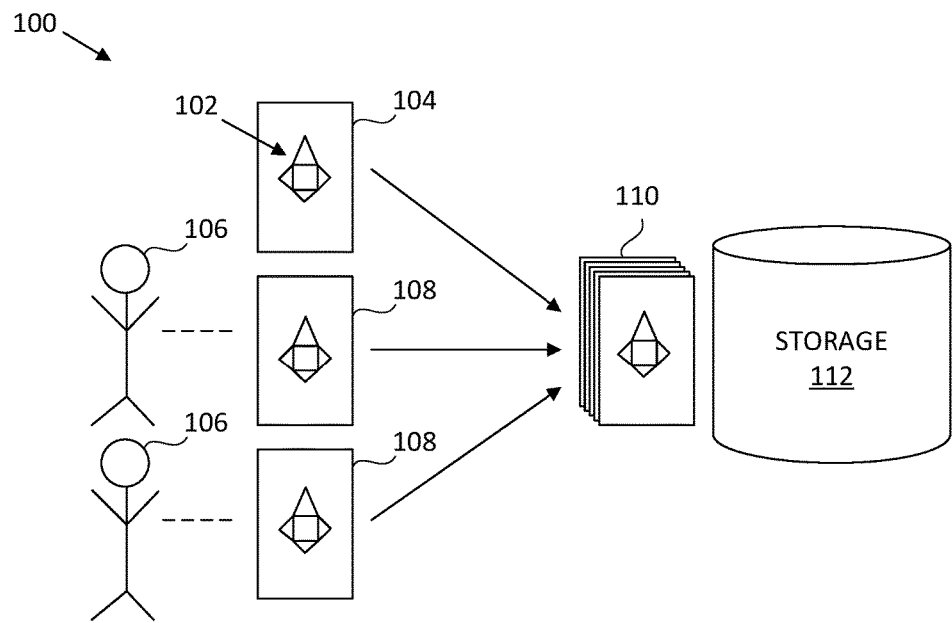
FIG. 1A shows an example image uploading and storage environment that is susceptible to inefficient storage of images.

Techniques are provided herein for more efficiently storing images that have a common subject, such as product images that share the same product in the image. Thousands of product photos may be uploaded through an e-commerce website, and each of these uploaded photos is stored on cloud servers or some other type of network storage. The servers themselves may be owned by the e-commerce company or by the company selling the product. Even after standard compression is performed on the uploaded photos, the amount of storage space required for so many product photos can become overwhelming. The techniques provided herein provide an intelligent and automatic end-to-end (E2E) solution that saves on the cost of image compression. The techniques leverage the fact that the same subject in each image has matching color regions. Accordingly, embodiments of the present disclosure provide a smart storage strategy that removes redundancy between images of the same subject (e.g., a same product), and compresses images based on the best compression technique to use for different sections of a given image. In some embodiments, redundancy could also be removed between images taken of different products so long as there is some similarity between them. For example, redundancy could be removed between images taken of a first shoe style from a given brand and images taken of a second shoe style from the same brand.

Each image received of a subject (such as a same product) undergoes an adaptive tiling procedure to split the image into a plurality of tiles, with each tile identifying a region of the image having pixels with a same RGB color intensity. The tiles across multiple images can then be clustered together based on how close their RGB values are, and those tiles having identical RGB color values are removed. Tiles that are found to share almost the same RGB color intensity (e.g., matching at least 70% of the pixels) may be broken down into smaller tiles. Once all duplicate tiles have been removed from the set of all tiles across the images, the tiles are once again clustered based on their encoding scheme and certain encoding parameters. The tiles within each cluster are then compressed using the best compression technique for the particular encoding scheme associated with the tiles in each corresponding cluster. The compressed tiles from each cluster can be saved as a single file or as any number of files. By removing duplicative tile content between numerous images of the same subject, the total amount of data that needs to be stored is reduced. Numerous variations and embodiments of the disclosed techniques will be appreciated in light of this disclosure.

General Overview

As noted above, large amounts of cloud storage are required for storing the many product photos or similar other associated photos found on the web, such as on e-commerce websites. As a result of storing so many images from so many different users, companies resort to many different methods to save on the cost of cloud storage. Image compression methods are most often used in an attempt to reduce the storage space needed, but using such methods across many images has drawbacks. For example, some of the known methods for lossy compression include discrete cosine transforms (DCT) and chroma subsampling while some of the known methods for lossless compression include run length encoding (RLE). Deflate, and LZW. Some compression methods are better suited for certain kinds of images compared to others and are better suited for certain properties within a given image. For example, transparent portions of an image are more efficiently compressed using lossy compression techniques. Accordingly, the ability to break images down into smaller tiles, remove duplicate tile content, and use the best-suited compression methods at the tile level rather than the image level all contribute to a more efficient storage strategy. Although discussion herein is mainly focused on product images, it should be understood that the image compression and storage techniques described herein can be applied to any series of images having some commonality between them.

The techniques may be embodied in devices, systems, methods, or machine-readable mediums, as will be appreciated. For example, according to a first embodiment of the present disclosure, a system is provided that is configured to efficiently store one or more image files. The system includes at least one processor and various modules executable by the processor(s) to carry out the process of efficiently storing the one or more image files. The modules include a tile generation module, a content clustering module, and a tile compression module. The tile generation module is designed to, for each of at least a first image and a second image, generate a first plurality of tiles, wherein each tile of the first plurality of tiles of a corresponding image includes pixels that are within a threshold color intensity of one another. The content clustering module is designed to generate a first plurality of tile clusters. Each tile cluster of the first plurality of tile clusters includes one or more tiles from one or both of the first image and the second image. For each tile cluster of the first plurality of tile clusters, any duplicate tiles from a corresponding tile cluster are removed, where pixels of the duplicate tiles share a same color intensity as another tile in the corresponding tile cluster. Any remaining tiles after removing any duplicate tiles constitute a second plurality of tiles. The tile compression module is designed to generate a second plurality of tile clusters. Each tile cluster of the second plurality of tile clusters includes one or more tiles from the second plurality of tiles sharing one or more same encoding parameters. The one or more tiles of a given tile cluster of the second plurality of tile clusters are compressed, thereby providing compressed one or more tiles, and stored as a file.

According to another embodiment of the present disclosure, a method for efficiently storing one or more image files is provided. The method includes receiving a plurality of images, the plurality including at least a first image and a second image; for each of the first and second images, generating a first plurality of tiles, wherein each tile of the first plurality of tiles of a corresponding image includes pixels that are within a threshold color intensity of one another; generating a first plurality of tile clusters, wherein each tile cluster of the first plurality of tile clusters includes tiles from one or both of the first image and the second image; for each tile cluster of the first plurality of tile clusters, removing any duplicate tiles from the corresponding tile cluster, wherein pixels of the duplicate tiles share a same color intensity as another tile in the corresponding tile cluster, and wherein remaining tiles after the removing constitute a second plurality of tiles; generating a second plurality of tile clusters, wherein each tile cluster of the second plurality of tile clusters includes one or more tiles from the second plurality of tiles, the one or more tiles sharing one or more same encoding parameters; compressing the one or more tiles of a given tile cluster of the second plurality of tile clusters, thereby providing compressed one or more tiles; and storing the compressed one or more tiles of the given tile cluster of the second plurality of tile clusters as a file.

Numerous examples are described herein, and many others will be appreciated in light of this disclosure.

System Environment

FIG. 1A illustrates an example image uploading and storage environment 100. Various images of a given product 102 may be provided by different users and uploaded to some centralized server or storage location. For example, a first set of images 104 are provided by a seller of product 102 while any number of second sets of images 108 of product 102 are provided by any number of users 106. Images 104 from the seller may be of higher quality or professionally created to make the product look as good as possible. Images 108 may be images taken from various image capturing devices of users 106, and thus may vary greatly in quality. In any case, each of the images 104 and images 108 include the same product 102. In one example, images 104 include product images found on an e-commerce website to advertise product 102 and entice users of the website to buy the product. Continuing the above example, images 108 may represent images that are uploaded by users that own product 102 and are providing their own photographs of product 102. These user images may be provided in a comment section for product 102 on the e-commerce website, or via any other means to post their own photos of product 102 to be viewed by other users of the e-commerce website.

Each of images 104 and/or images 108 can be in any file format, such as JPEG, RLE, PNG, GIF, or TIFF to name a few examples. Accordingly, and owing also to the fact that different image capturing devices are used, images 104 and images 108 may vary greatly in file size. Product 102 may have a different size or location within any of images 104 and images 108.

Each of images 104 and images 108 are stored together as a stored set of images 110 within storage 112. Stored set of images 110 may include hundreds or thousands of images of product 102. Each image within stored set of images 110 may include image metadata that associates the image with the given product 102. Storage 112 may represent one or more cloud servers or any other type of network-accessible storage. Images within stored set of images 110 can be compressed using any number of known compression techniques.

Figure 1B:
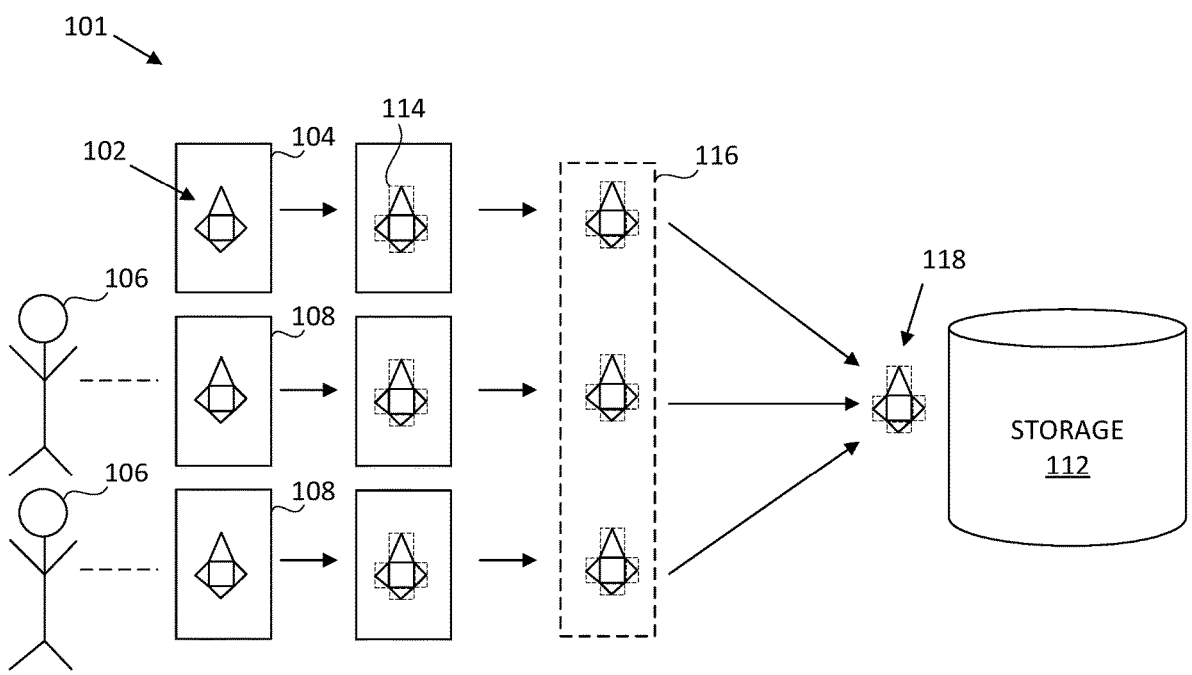
FIG. 1B shows an image uploading and storage environment configured for efficient storage of images, in accordance with an embodiment of the present disclosure.

As can be seen in image uploading and storage environment 100, the content of multiple images is stored within storage 112, even though the images all include the same product 102. While this may be acceptable for some image storage applications, storage space becomes tight very quickly as more and more images are uploaded, especially considering the number of images uploaded for multiple different products. Thus, and in accordance with an embodiment, FIG. 1B illustrates another image uploading and storage environment 101 that utilizes adaptive tiling and clustering techniques to more efficiently store the content from images 104 and images 108, as will be explained in turn.

Image uploading and storage environment 101 includes the same images 104 and images 108 of product 102 as described above, as well as the same storage 112. However, each image undergoes an adaptive tiling process that identifies a plurality of tiles 114 within each image. Each tile identifies a content region of the image. A given content region may include pixels having a same RGB color intensity. Further details of the adaptive tiling process are provided herein (see, for example, tile generation module 218 of FIG. 2 as well as the example tiling methodology of FIG. 6).

Once tiles have been identified across the various images 104 and/or images 108, the tiles are clustered (generally represented by cluster stage 116) based on, for example, similar content characteristics. Within a given cluster, if the content match is 100% between tiles, then duplicate tiles are removed. The result is that a product representation 118 is ultimately stored that includes stored content regions of product 102 that are linked to the tiles 114 identified across each of the images 104 and/or images 108. By storing content of only some of the tiles associated with product 102 across the various images 104 and/or images 108, the total storage needed for images 104 and/or images 108 is reduced. Additionally, by breaking the images into tiles and storing tiles rather than whole images, different compression techniques can be used for different tiles depending on which techniques work better based on the tile characteristics. Further details of the clustering and compression processes are provided herein (see, for example, content clustering module 220 and tile compression module 222 of FIG. 2 as well as the example clustering methodology of FIGS. 7-8).

The process of breaking the images into tiles and compressing/storing various ones of the tiles may be performed by a computing device associated with storage 112, such as a server computer system, or a client computer system that can access storage 112 either directly or via a server. As will be further appreciated, such processing may be distributed between client and server computers, according to still other embodiments. Additionally, the illustrated transmission of the content of images 104 and images 108 to storage 112 may be performed via any number of computing devices and networks.

Figure 2:
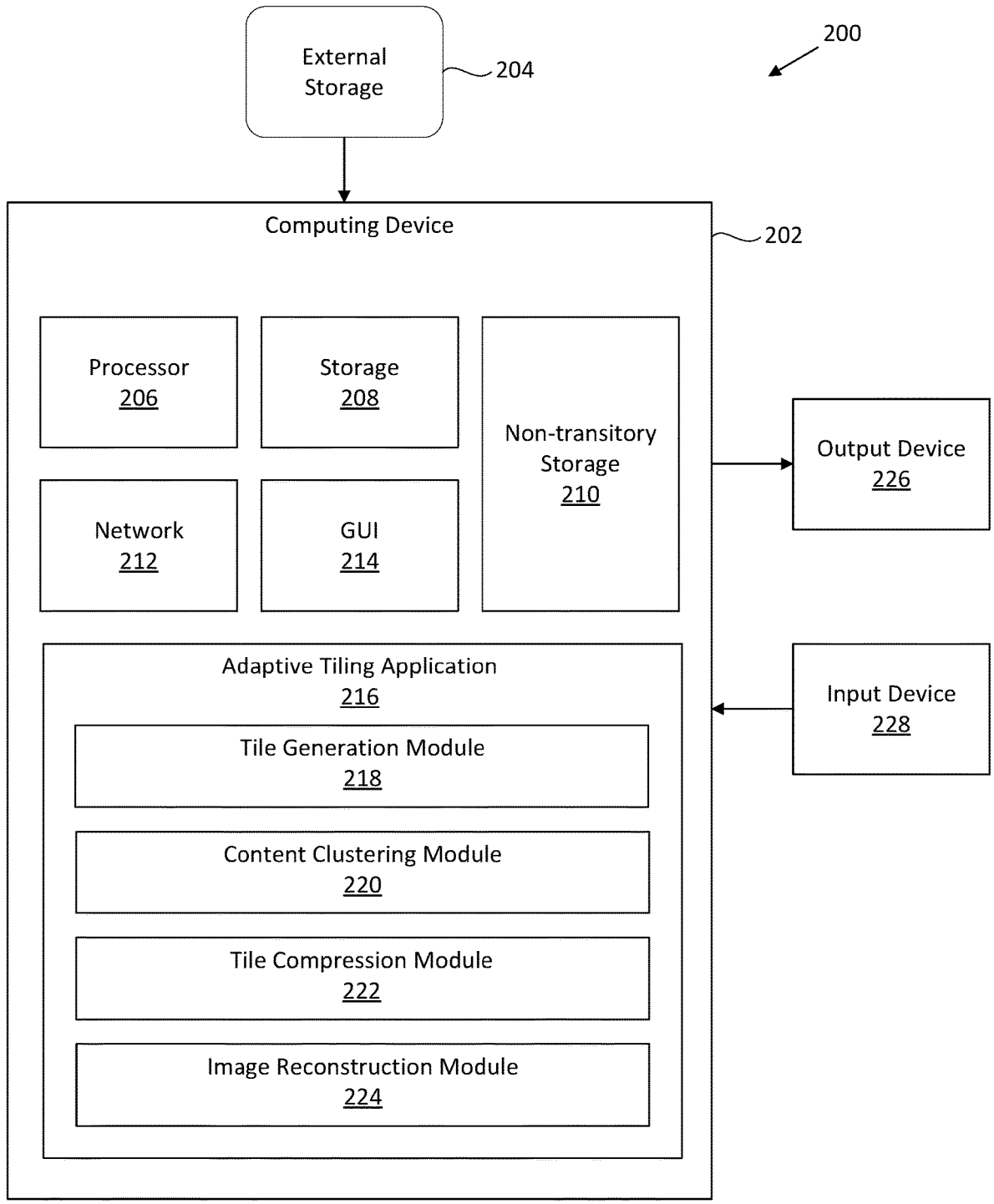
FIG. 2 shows an example system having an adaptive tiling application, in accordance with an embodiment of the present disclosure.

FIG. 2 shows an example system 200 that, among other things, implements an adaptive tiling application 216 to break received images into different tiles that can be managed and stored more efficiently, according to an embodiment. The system 200 includes various hardware components such as a computing device 202 having a processor 206, a storage 208, a non-transitory storage medium 210, a network interface 212, and a graphical user interface (GUI) 214. As will be appreciated, adaptive tiling application 216 may be part of a more comprehensive image processing application. GUI 214 may include a display and a user input device. In some embodiments, GUI 214 represents a command-line interface.

According to some embodiments, processor 206 of the computing device 202 is configured to execute the following modules of adaptive tiling application 216, each of which is described in further detail below: tile generation module 218, content clustering module 220, tile compression module 222, and image reconstruction module 224. In some embodiments, computing device 202 is configured to receive or retrieve one or more images (e.g., of one or more products) that are stored in external storage 204 or storage 208. External storage 204 may be local to device 202 (e.g., plug-and-play hard drive) or remote to device 202 (e.g., cloud-based storage), and may represent, for instance, a stand-alone external hard-drive, external FLASH drive or any other type of FLASH memory, a networked hard-drive, a server, or networked attached storage (NAS), to name a few examples. As will be discussed in more detail herein, each of the modules 218, 220, 222, and 224 are used in conjunction with each other to complete a process for more efficiently storing received images in one or both of storage 208 or external storage 204.

Computing device 202 can be any computer system, such as a workstation, desktop computer, server, laptop, handheld computer, tablet computer (e.g., the iPad® tablet computer), mobile computing or communication device (e.g., the iPhone® mobile communication device, the Android™ mobile communication device, and the like), virtual reality (VR) device or VR component (e.g., headset, hand glove, camera, treadmill, etc.) or other form of computing or telecommunications device that is capable of communication and that has sufficient processor power and memory capacity to perform the operations described in this disclosure. A distributed computational system can be provided including a plurality of such computing devices. Further note that computing device 202 may be, for example, a client in a client-server arrangement, wherein at least a portion of the adaptive tiling application 216 is served or otherwise made accessible to computing device 202 via a network (e.g., the Internet and a local area network that is communicatively coupled to the network interface 212).

Computing device 202 includes one or more storage devices 208 or non-transitory computer-readable mediums 210 having encoded thereon one or more computer-executable instructions or software for implementing techniques as variously described in this disclosure. The storage devices 208 can include a computer system memory or random access memory, such as a durable disk storage (which can include any suitable optical or magnetic durable storage device, e.g., RAM, ROM, Flash, USB drive, or other semiconductor-based storage medium), a hard-drive, CD-ROM, or other computer readable mediums, for storing data and computer-readable instructions or software that implement various embodiments as taught in this disclosure. The storage device 208 can include other types of memory as well, or combinations thereof. The non-transitory computer-readable medium 210 can include, but are not limited to, one or more types of hardware memory, non-transitory tangible media (for example, one or more magnetic storage disks, one or more optical disks, one or more USB flash drives), and the like. The non-transitory computer-readable medium 210 included in the computing device 202 can store computer-readable and computer-executable instructions or software for implementing various embodiments (such as instructions for an operating system as well as image processing software that includes adaptive tiling application 216). The computer-readable medium 210 can be provided on the computing device 202 or provided separately or remotely from the computing device 202.

The computing device 202 also includes at least one processor 206 for executing computer-readable and computer-executable instructions or software stored in the storage device 208 or non-transitory computer-readable medium 210 and other programs for controlling system hardware. Processor 206 may have multiple cores to facilitate parallel processing or may be multiple single core processors. Any number of processor architectures can be used (e.g., central processing unit and co-processor, graphics processor, digital signal processor). Virtualization can be employed in the computing device 202 so that infrastructure and resources in the computing device 202 can be shared dynamically. For example, a virtual machine can be provided to handle a process running on multiple processors so that the process appears to be using only one computing resource rather than multiple computing resources. Multiple virtual machines can also be used with one processor. Network interface 212 can be any appropriate network chip or chipset which allows for wired or wireless connection between the computing device 202 and a communication network (such as local area network) and other computing devices and resources.

A user can interact with the computing device 202 through an output device 226, such as a screen or monitor, which can display one or more user interfaces or images, including reconstructed images of products or other subjects, as provided in accordance with some embodiments.

Computing device 202 can include input or input/output devices 228 for receiving input from a user, for example, a keyboard, a joystick, a game controller, a pointing device (e.g., a mouse, a user's finger interfacing directly with a touch-sensitive display device, etc.), or any suitable user interface, including an AR headset. The computing device 202 may include any other suitable conventional I/O peripherals. In some embodiments, computing device 202 includes or is operatively coupled to various suitable devices for performing one or more of the aspects as variously described in this disclosure.

The computing device 202 can run any operating system, such as any of the versions of Microsoft® Windows® operating systems, the different releases of the Unix® and Linux® operating systems, any version of the MacOS® for Macintosh computers, any embedded operating system, any real-time operating system, any open source operating system, any proprietary operating system, any operating systems for mobile computing devices, or any other operating system capable of running on the computing device 202 and performing the operations described in this disclosure. In an embodiment, the operating system can be run on one or more cloud machine instances.

In other embodiments, the functional components/modules can be implemented with hardware, such as gate level logic (e.g., FPGA) or a purpose-built semiconductor (e.g., ASIC). Still other embodiments can be implemented with a microcontroller having several input/output ports for receiving and outputting data, and several embedded routines for carrying out the functionality described in this disclosure. In a more general sense, any suitable combination of hardware, software, and firmware can be used, as will be apparent.

As will be appreciated in light of this disclosure, the various modules and components of the system, such as adaptive tiling application 216, tile generation module 218, content clustering module 220, tile compression module 222, image reconstruction module 224, GUI 214, or any combination of these, may be implemented in software, such as a set of instructions (e.g., HTML, XML, C, C++, object-oriented C, JavaScript®, Java®, BASIC, etc.) encoded on any machine-readable medium or computer program product (e.g., hard drive, server, disc, or other suitable non-transitory memory or set of memories), that when executed by one or more processors, cause the various methodologies provided in this disclosure to be carried out. It will be appreciated that, in some embodiments, various functions and data transformations performed by the user computing system, as described in this disclosure, can be performed by one or more suitable processors in any number of configurations and arrangements, and that the depicted embodiments are not intended to be limiting. Various components of this example embodiment, including the computing device 202, can be integrated into, for example, one or more desktop or laptop computers, workstations, tablets, smart phones, game consoles, VR devices, set-top boxes, or other such computing devices. Other componentry and modules typical of a computing system, will be apparent.

According to some embodiments, tile generation module 218 is configured to identify various content regions within an image and to create tiles to bound the various content regions. The content regions are identified based on similar characteristics of neighboring pixels, such as pixels that have a same RGB intensity value, or a RGB intensity value within some threshold percentage of one another. Once content regions have been identified, the edges of each content region are bounded by a rectangular tile (e.g., a bounding box). This process is repeated for any number of received or already-stored images to break each image into a plurality of tiles corresponding to the different content regions of the image.

According to some embodiments, the different content regions of an image are initially identified by using a plurality of random pixels scattered across the image. The content regions are then "grown" from these random pixels by adding neighboring pixels that have the same RGB intensity value (or within some threshold percentage) until boundaries form at the edges of all content regions within the image. Rectangular tiles are then used to bound each of the content regions, although other tile shapes could be used as well. Further details regarding the tile generation process are provided herein with reference to FIG. 6.

According to some embodiments, content clustering module 220 forms clusters of tiles taken from all tiles across a plurality of images based on how closely the content matches between the tiles. For example, tiles that include content regions with pixels having the same RGB intensity are clustered together. Because all of the tiles within such a cluster have the same content, duplicate tiles within the cluster can be removed to reduce the amount of storage required. Some clusters may include tiles that have closely related content, but not exactly the same. For example, some clusters can include tiles having content match of at least 70%, at least 75%, at least 80%, at least 85%, at least 90%, or at least 95%, but less than 100% in all examples. In such cases, the tiles within such clusters are broken into smaller tiles and the smaller tiles are once again compared to one another to determine content similarity and if any of the smaller tiles can be removed for being duplicative. Further details regarding the clustering process based on tile content are provided herein with reference to FIG. 7.

According to some embodiments, tile compression module is configured to take the remaining tiles after duplicate tiles have been removed by the content clustering module 220 and re-cluster the remaining tiles based on one or more similar encoding parameters between the tiles. For example, tiles that have particular encoding parameters indicating a certain level of transparency may be clustered together. Other examples may include encoding parameters that indicate color variety or other image effects. Once the tiles have been clustered based on similar encoding parameters, the tiles within each cluster can be compressed using a compression format that is best suited for those tiles, according to an embodiment. For example, in the cluster described above that includes tiles having a certain transparency level, a PNG compression format may be chosen (as opposed to JPEG, for example) as it is better suited for dealing with transparency effects. The compressed tiles of a given cluster may be compressed into a single file or across multiple files. Further details regarding the clustering and compression process based on tile encoding parameters are provided herein with reference to FIG. 8.

According to some embodiments, image reconstruction module 224 is configured to receive a request for an image and reconstruct the image based on the stored tiles. For example, upon receiving a request for image, image reconstruction module 224 determines what tiles are associated with the requested image (since each image has been broken down into tiles from tile generation module 218) and then maps each of the image's tiles to corresponding stored tiles that have the same content. The content from the corresponding tiles is then used to reconstruct the image by populating the image's tiles with the corresponding tile content. The mapping correspondence between image tiles is facilitated with stored data structures for each tile that provide tile metadata regarding features such as, for example, the tile's associated image ID, the tile's location within the image, the compression algorithm used for the tile, etc. Further details regarding the reconstruction of images based on stored tile content are provided herein with reference to FIG. 9.

Figure 3A:
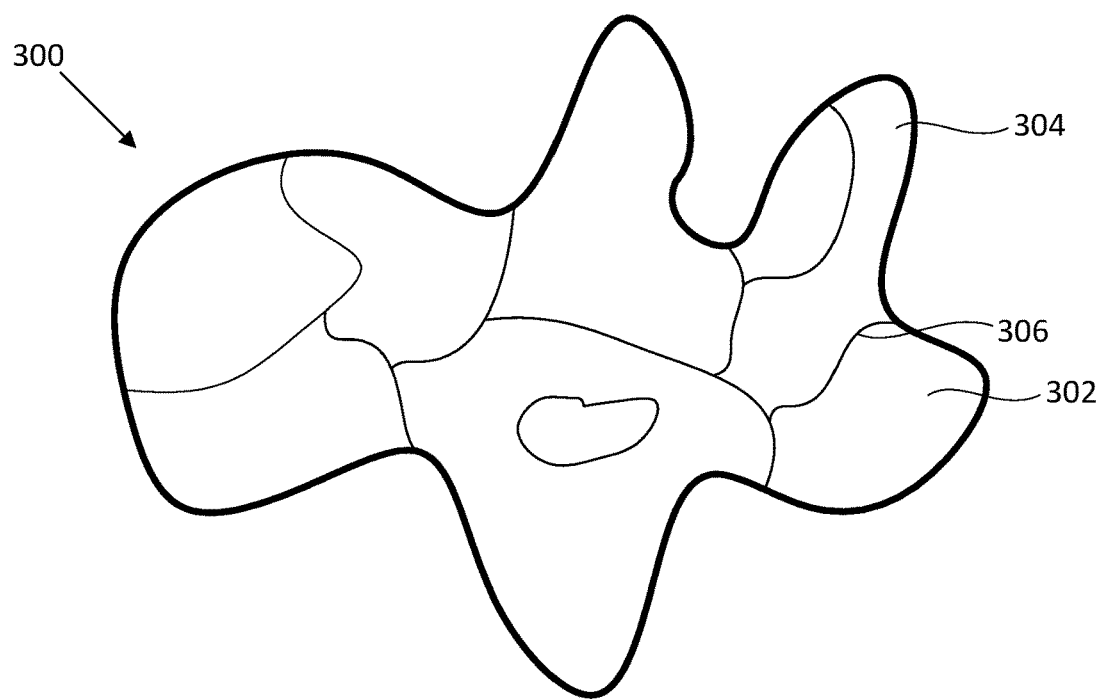
FIG. 3A shows an example of a plurality of identified content regions of an object in an image, in accordance with an embodiment of the present disclosure.

FIG. 3A illustrates an example object 300 within an image, according to an embodiment. Object 300 may represent a product or any other physical entity that is present within an image. Object 300 includes a plurality of different content regions, such as a first content region 302 and a second content region 304 separated by a boundary 306. Each content region includes pixels that share a common quality, such as a common RGB intensity value. In some embodiments, each content region includes pixels that have an RGB intensity value within some threshold percentage of one another. For example, first content region 302 may include a collection of neighboring pixels that all have the same shade of green while second content region 304 includes a collection of neighboring pixels that all have the same shade of red or a different shade of green.

According to some embodiments, each content region is defined by boundaries, such as boundary 306 between first content region 302 and second content region 304. Boundaries may be formed when determining that neighboring pixels either no longer have the same RGB color intensity value or are outside a threshold percentage RGB color intensity difference. For example, when pixels transitioned from having one RGB color intensity value within first content region 302 to having a different RGB intensity value within second content region 304, the boundary 306 is identified between the two content regions. This process occurs across object 300, and possibly more broadly across the entire image, to form various content regions. In some embodiments, the process continues until each pixel of object 300 or of the image as a whole is included in a content region.

According to some embodiments, each of the content regions is initially formed by randomly assigning pixels across object 300 or across the entire image to act as seed pixels. In some examples, 15%, 20%, 25%, or 30% of the total image pixels or total pixels of object 300 are randomly selected to be seed pixels. Next, an RGB intensity value of each seed pixel is identified and the content regions are grown from the seed pixels by identifying neighboring pixels having the same RGB intensity value or an RGB intensity value within some threshold percentage of one another. Once pixels are reached that do not meet this criteria to be part of the same content region, a boundary is identified at that location. In this way, content regions grow outwards until they are completely bounded either by identified boundaries or edges of the image itself. FIG. 3A illustrates just one example of how object 300 can be made up of multiple content regions.

Figure 3B:
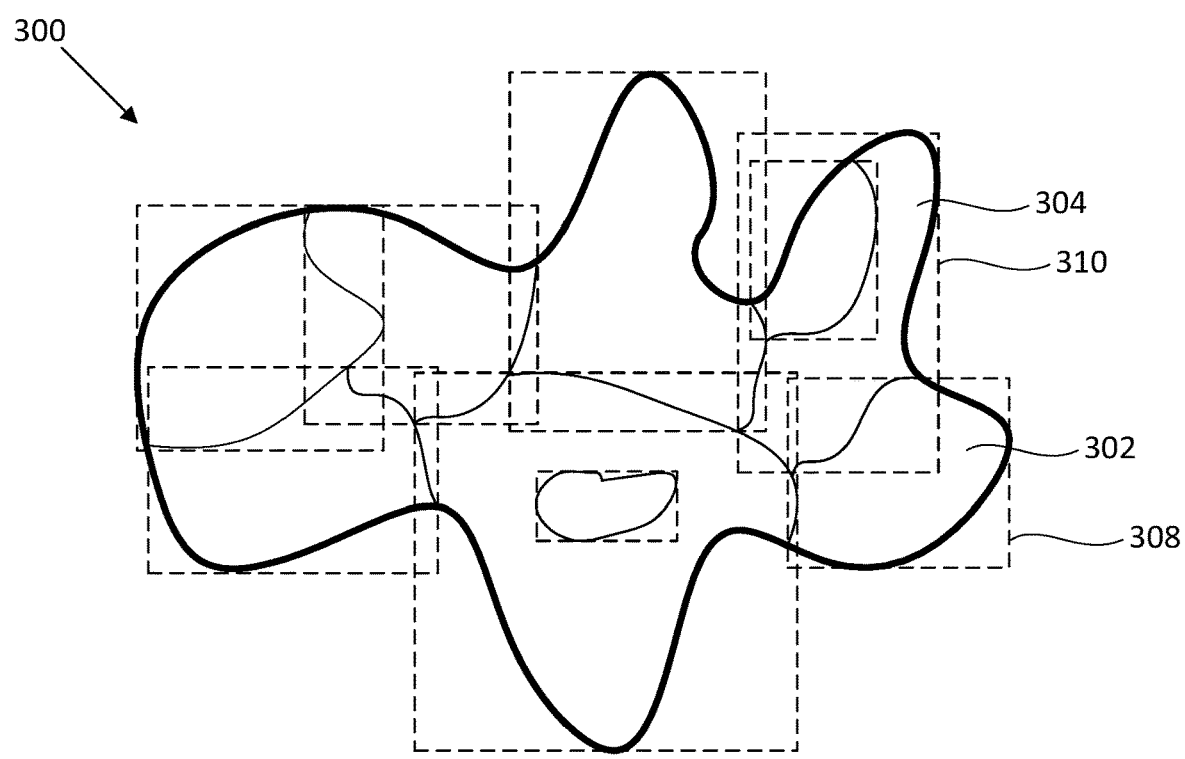
FIG. 3B shows an example of tiles corresponding to the plurality of identified content regions in FIG. 3A, in accordance with an embodiment of the present disclosure.

FIG. 3B illustrates how object 300 is broken down into a plurality of tiles that define each of the content regions, according to an embodiment. In the illustrated example, first content region 302 is bounded by a first rectangular tile 308 and second content region 304 is bounded by a second rectangular tile 310. Each tile extends to the edges of the boundaries of the associated content region to ensure that all pixels within the content region are include in the tile. In some embodiments, tiles can be set to have a maximum size and any tiles that would be bigger than the maximum size are instead broken into two or more tiles to cover the same content region. For example, if a maximum tile size is set to 128×128 pixels, then any content region that extends beyond 128 pixels in either the X or Y direction would be classified by using more than one tile.

Figure 4:
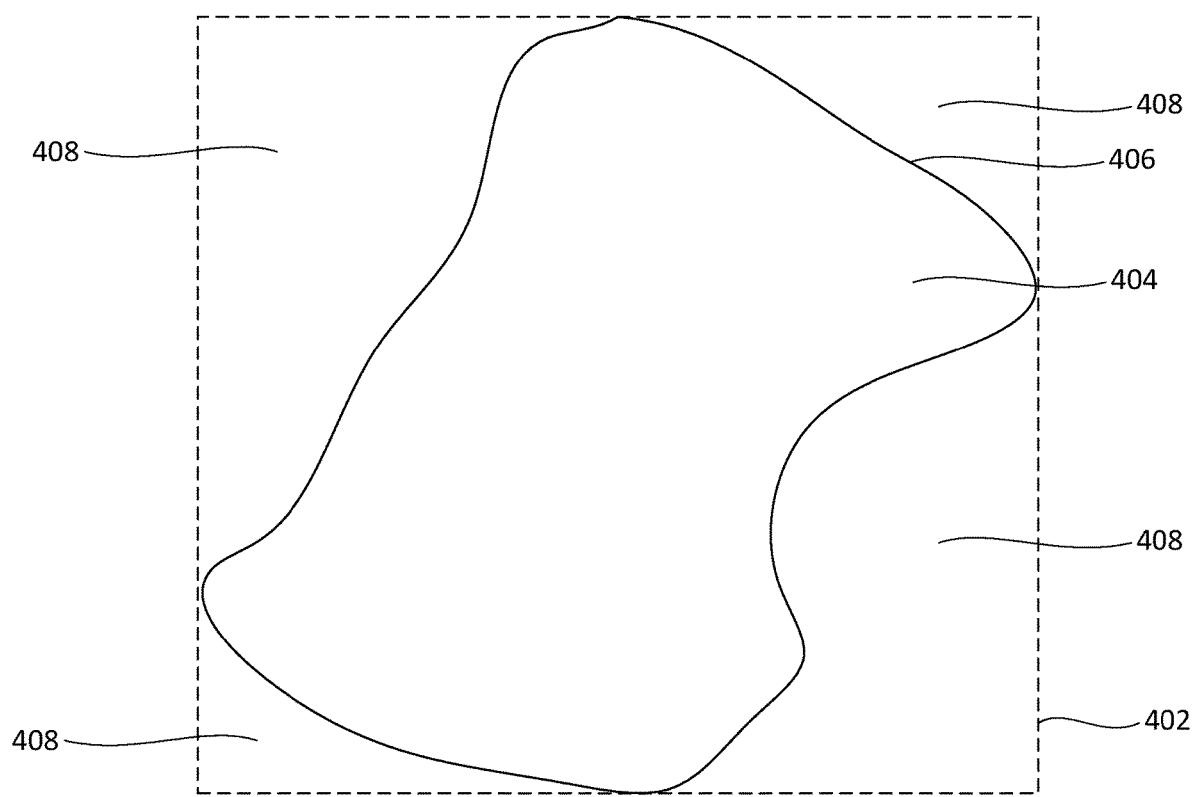
FIG. 4 shows an example of various regions within a tile, in accordance with an embodiment of the present disclosure.

Not all pixels bound within the four corners of a tile are considered a part of that tile since content regions can have any shape. FIG. 4 illustrates an example of a tile 402 used around a content region 404. All pixels within content region 404 that are bounded by boundary 406 are part of tile 402. However, all pixels within outer regions 408 outside of boundary 406 are not included as part of tile 402.

In some embodiments, metadata associated with each tile includes numerous information fields about the tile. For example, tile metadata may be stored in a structure that includes fields for identifying the location of the tile within an image (e.g., an X, Y location), a size of the tile, an image ID that the tile is from, a compression algorithm used for the tile, and a mask field, to name a few examples. The mask field may be used to identify the region within the tile that includes the pixels of interest. In the example illustrated in FIG. 4, the mask field for tile 402 would indicate that only pixels within content region 404 are considered part of tile 402. In some embodiments, the mask field includes a series of coordinates to identify the location of boundary 406.

Figure 5:
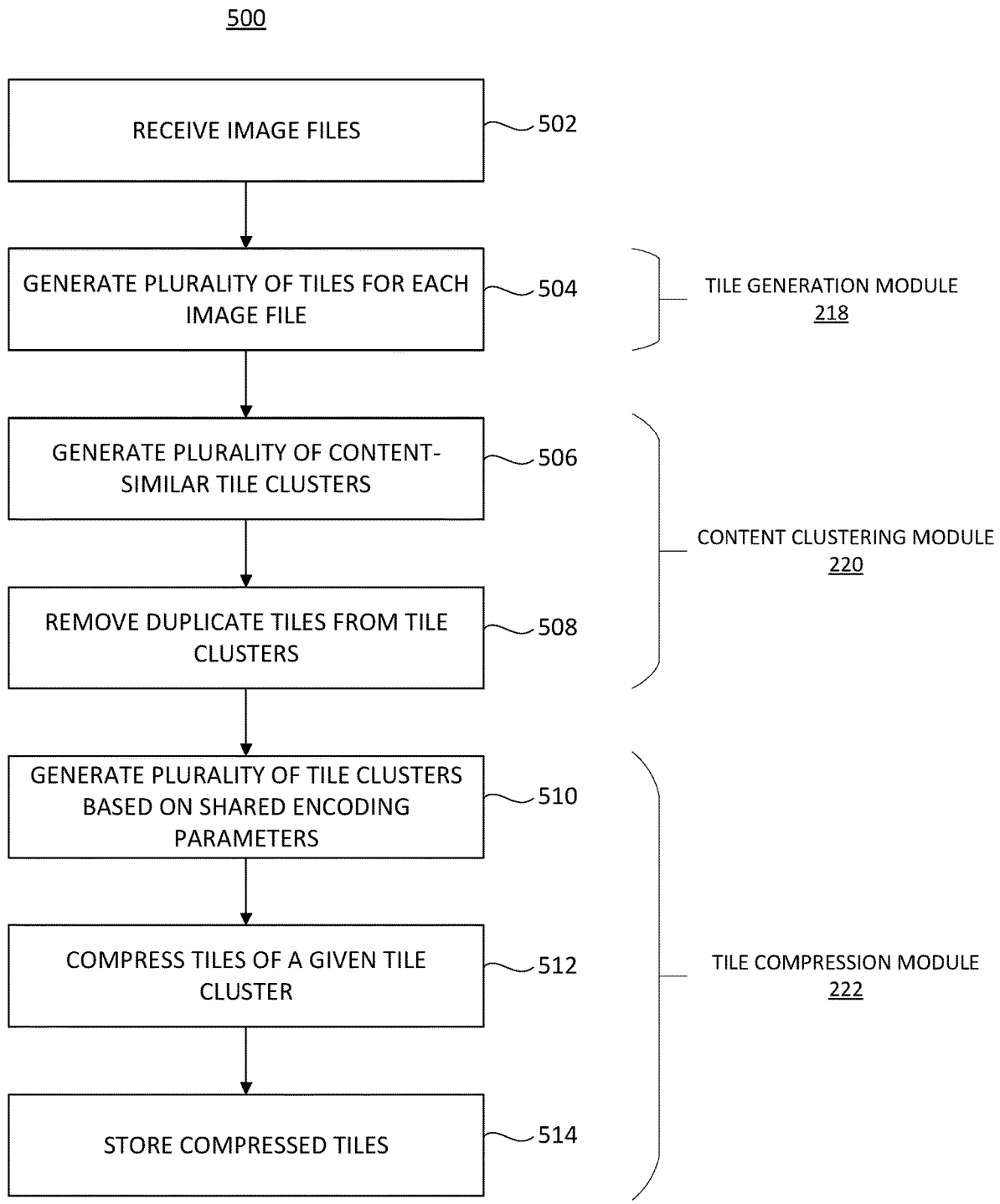
FIG. 5 is a flow diagram of a process for efficiently storing one or more image files, in accordance with some embodiments of the present disclosure.

FIG. 5 illustrates an example method 500 of efficiently storing image files by breaking the image files into tiles and storing at least a subset of the tiles, according to an embodiment. The operations, functions, or actions described in the respective blocks of example method 500 may be stored as computer-executable instructions in a non-transitory computer-readable medium, such as a memory and/or a data storage of a computing system. As will be further appreciated in light of this disclosure, for this and other processes and methods disclosed herein, the functions performed in method 500 may be implemented in a differing order. Additionally, or alternatively, two or more operations may be performed at the same time or otherwise in an overlapping contemporaneous fashion.

At block 502, a plurality of image files are received or accessed. The image files may be received at, for example, a computing device that acts as a server or cloud server for facilitating data storage. For example, the image files may be received at a cloud server that is designed to be a web server that stores images used for one or more websites. In some embodiments, the plurality of image files are accessed from storage coupled to a computing device.

The image files may include images of certain products, such as images of a particular product that are provided by the seller of the product, and images of the product provided by customers that purchased the product. Accordingly, each of the images may include a same subject within the image (e.g., the product) that thus will share similar content regions for the product within each image. The image files may be in any format, such as JPEG, TIFF, GIF, BMP, or PNG, to name a few examples.

At block 504, a plurality of tiles for each of the received or accessed images are generated using, for example, tile generation module 218, according to an embodiment. Random pixels throughout a given image are selected to be seed pixels and content regions are grown from these seed pixels to identify the various content regions in the image. Content regions may be defined by groups of neighboring pixels that share either a same RGB intensity or have an RGB intensity within a threshold percentage of one another. Once content regions are identified within the image, rectangular tiles are used to bound each of the content regions. In some embodiments, tiles having any shape are used to surround each of the content regions. The tiles are adaptively formed to fit any size content region in any location on the image. This process may be repeated for any number of images to generate a plurality of tiles across all of the images. More detailed operations of block 504 are provided in FIG. 6.

At block 506, a plurality of tile clusters are identified based on content similarity using, for example, content clustering module 220, according to an embodiment. The clusters of tiles can draw from any tiles across any of the received or accessed plurality of images. Thus, a single cluster of content-similar tiles may include tiles from any number of images. In some embodiments, before tile clustering occurs, a subset of the images is identified that includes an overall high template match. For example, images having at least an 80% template match may be included in the image subset for further processing. In this way, images of a same subject (such as a same product) can be identified first before clusters are formed using the tiles from the images of the identified subset.

As noted above, the tiles are clustered into groups based on content similarity. For example, tiles having 100% matching RGB intensity values are grouped together, tiles having between 95% and 99% RGB intensity value are grouped together, and so forth. Certain tile groups with content matching above a given threshold may have the tiles within those tile groups broken into smaller tiles. For example, groups having tiles with RGB intensity values that match at least 70% are identified and the tiles within those groups are broken into smaller tiles that are clustered again into groups based on content similarity between the smaller tiles. The smaller tiles may be clustered again into groups in an attempt to create new tile clusters with 100% matching content. In some embodiments, this process of breaking tiles into smaller tiles can continue until tiles reach a certain lowest size such as, for example, 32×32 pixels.

At block 508, for each of the groups having 100% matching content, duplicate tiles within the group are removed since they have the same content as another tile within the group that will be stored, according to an embodiment. The operations of block 508 may be performed by content clustering module 220. The reduction of the total number of tiles based on content similarity across images drastically reduces the storage space required to store the images. More detailed operations of blocks 506 and 508 are provided in FIG. 7.

At block 510, each of the remaining tiles are clustered again based on shared one or more encoding parameters between the tiles using, for example, tile compression module 222, according to an embodiment. The encoding parameters for a particular tile may be used to determine what compression algorithm provides the highest quality and maximum size reduction for the tile. An example of an encoding parameter is a transparency level present in the tile. Transparency effects are handled by some compression algorithms better than others, and so the level of transparency present in the tile may affect what compression algorithm is ultimately chosen for the tile. Tiles that share one or more encoding parameters are clustered together in groups.

At block 512, tiles within a given clustered group based on shared encoding parameters are compressed using a suitable compression algorithm that best suits the corresponding shared encoding parameters, according to an embodiment. The operations of block 512 may be performed by tile compression module 222. Tiles may be compressed using any of a number of known compression algorithms, from which one is selected based on the shared one or more encoding parameters between the tiles. For example, if the tiles share a high degree of transparency effects, then PNG compression may be selected as it provides more efficient compression for such transparency effects. The tiles of a given clustered group may be compressed into a single file or across multiple files.

At block 514, the compressed files from block 512 are stored using, for example, tile compression module 222, according to an embodiment. The compressed files may be organized in an indexed fashion such that they can be easily identified during reconstruction of an image comprised of tiles from across one or more of the compressed files. More detailed operations of blocks 510, 512, and 514 are provided in FIG. 8.

Figure 6:
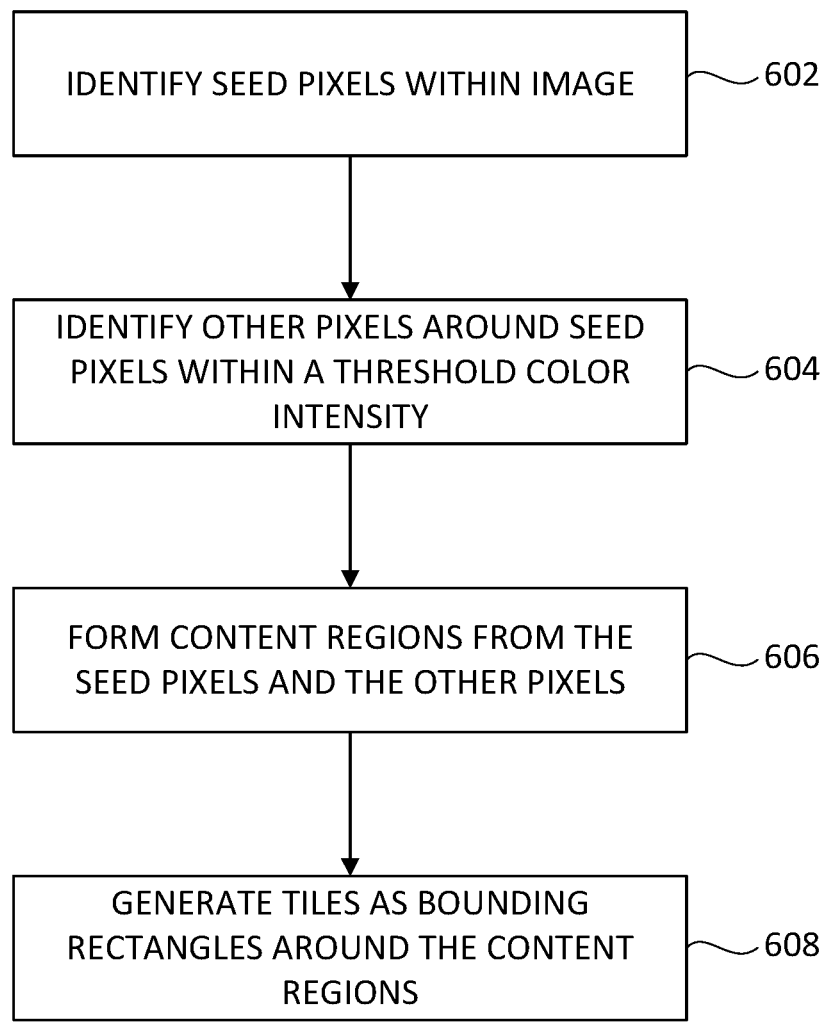
FIG. 6 is a flow diagram of a process for generating a plurality of tiles for a given image, in accordance with some embodiments of the present disclosure.

FIG. 6 illustrates an example flowchart providing further operations of block 504 (also referred to herein as method 600) from method 500, according to an embodiment. The operations, functions, or actions described in the respective blocks of example method 600 may be stored as computer-executable instructions in a non-transitory computer-readable medium, such as a memory and/or a data storage of a computing system. As will be further appreciated in light of this disclosure, for this and other processes and methods disclosed herein, the functions performed in method 600 may be implemented in a differing order. Additionally, or alternatively, two or more operations may be performed at the same time or otherwise in an overlapping contemporaneous fashion.

At block 602, a plurality of seed pixels within an image are identified. In some embodiments, the seed pixels are randomly assigned from amongst all of the pixels within the image. For example, around 20%, around 25%, around 30%, or around 35% of all of the pixels are identified as being seed pixels. The random arrangement of seed pixels is done to ensure that at least one seed pixel is within each different content region of the image. In some embodiments, the randomization may be partially weighted in certain portions of the image where there are many color changes (e.g., indicating many different content regions in that portion of the image).

At block 604, other pixels surrounding each of the seed pixels are identified that have either a same threshold RGB color intensity or are within a threshold RGB color intensity, according to some embodiments. For example, if a seed pixel has an RGB color intensity that indicates that it is a "light green" pixel, surrounding pixels are identified that also have the same "light green" RGB color intensity as these pixels together form a content region within the image. In this way, content regions are grown outwards from each seed pixel. Pixels that share the same color intensity or are close enough (e.g., within some threshold value) continue to be identified up until one or more pixels are identified that do not share the same color intensity (or are outside of the threshold value). These non-matching pixels indicate a boundary for the content region and the formation of the boundary around a given collection of pixels forms the content region as indicated at block 606. Each content region includes one or more of the random seed pixels along with the other identified pixels that share the same or similar RGB color intensity as the one or more seed pixels. Ultimately, and in accordance with some embodiments, all pixels of the image will be included within a corresponding content region. In some other embodiments, at least all of the pixels that make up the subject of the image (such as a product within the image) are included within a corresponding content region.

At block 608, tiles are formed around each of the content regions generated at block 606. According to some embodiments, the tiles are rectangular such that they bound the farthest extents of each content region. The tiles may partially or fully overlap one another depending on the shape and position of the various content regions. According to some embodiments, each tile has associated metadata to track information about the tile. This metadata may be in the form of a structure containing various data fields, such as the example structure shown below:

```
Struct Tile
{       Point                   mLocationInImage;
        Size                    mTileSize;
        ImageID                 mSourceImageID;
        CompressionAlgorithm    mCmpAlgo;
}       Mask                    mTileMask;
```

In this tile structure example, a particular tile includes data fields that provide the XY coordinates for the location of the tile within the image (mLocationInImage), the size of the tile (mTileSize), an identifier for the image that the tile is from (mSourceImageID), the compression algorithm used for the tile (mCmpAlgo), and mask data that identifies the valid region of pixels that are part of the tile (mTileMask), which is described above in more detail with regards to FIG. 4. Any other data fields that provide tile details may be included as well. According to some embodiments, the location of the tile (mLocationInImage) may include XY coordinates for a particular corner of the tile while the size of the tile (mTileSize) includes length (X) and height (Y) values for the tile with respect to the corner location. According to some embodiments, each tile from a given image includes the same image identifier (mSourceImageID).

Figure 7:
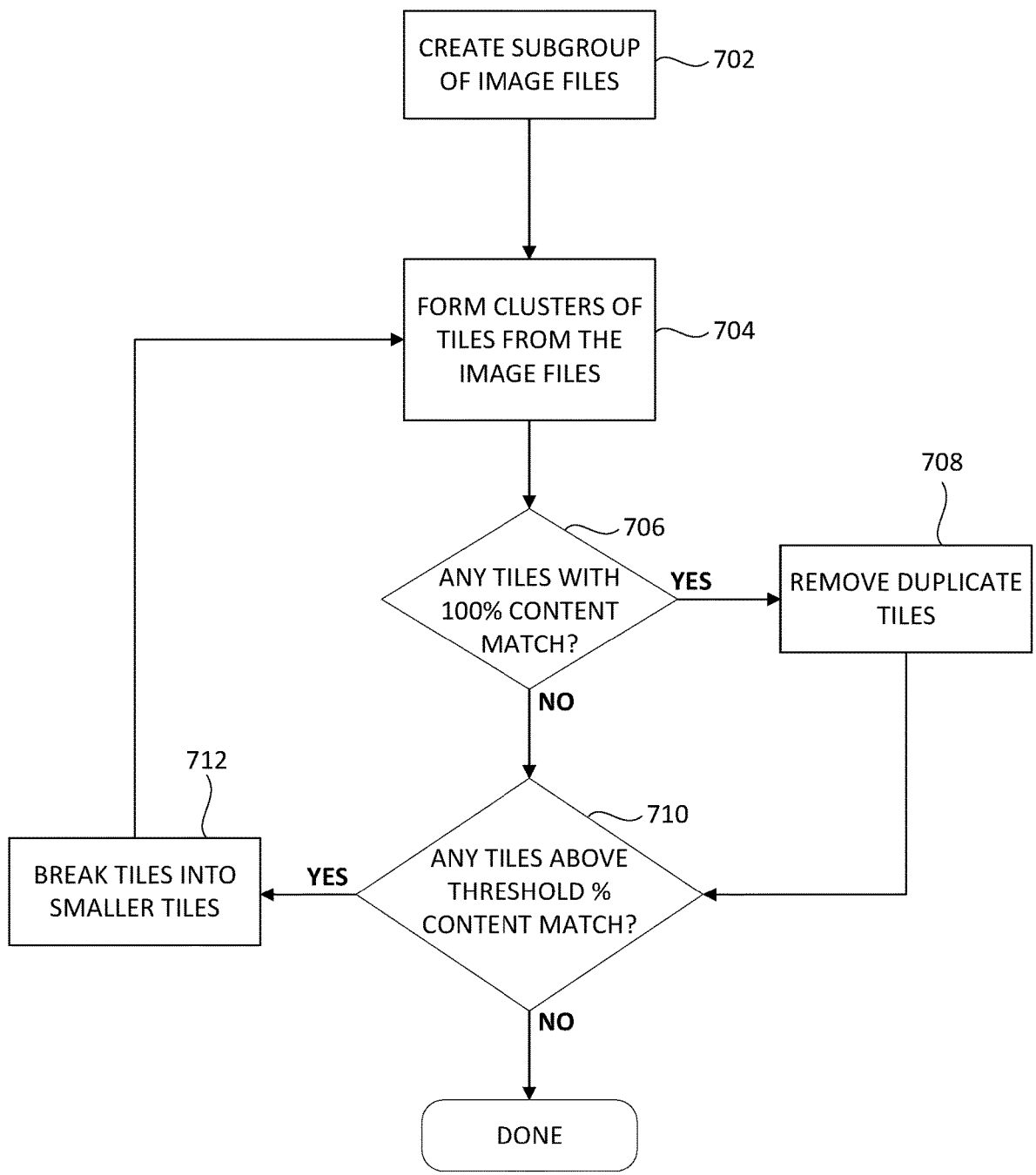
FIG. 7 is a flow diagram of a process for clustering tiles based on content and removing duplicate tiles, in accordance with some embodiments of the present disclosure.

FIG. 7 illustrates an example flowchart providing further operations of blocks 506 and 508 (also referred to herein as method 700) from method 500, according to an embodiment. The operations, functions, or actions described in the respective blocks of example method 700 may be stored as computer-executable instructions in a non-transitory computer-readable medium, such as a memory and/or a data storage of a computing system. As will be further appreciated in light of this disclosure, for this and other processes and methods disclosed herein, the functions performed in method 700 may be implemented in a differing order. Additionally, or alternatively, two or more operations may be performed at the same time or otherwise in an overlapping contemporaneous fashion.

At block 702, a subgroup of image files is created. This operation is performed to first group the image files that most likely include the same subject, such as a same product. There may be image files either received or stored from any number of different subjects, and trying to match up similar content regions between image files of different subjects would not be efficient. According to some embodiments, the subgroup of image files are formed by using a K nearest neighbors (KNN) clustering algorithm to identify image files having at least a threshold percentage template match. The threshold percentage may be at least an 80% template match, to provide one example. Other pattern recognition algorithms may be used either instead of or in addition to the KNN clustering algorithm to identify closely matched images. According to some embodiments, the operations of block 702 are only performed when receiving or accessing a plurality of image files of different subjects. If all image files are of the same subject, then the operations of block 702 may not be required. Furthermore, if only a single image file is received or accessed, then a subgroup cannot be formed from only the single image file.

At block 704, clusters of tiles are formed based on content similarity between the clusters. The tiles may be clustered from across any of the image files in the subgroup identified from block 702. In some other embodiments, the tiles may be clustered from across one or more of the received or accessed images and one or more other stored images. The tiles are clustered into groups based on content similarity. For example, tiles having 100% matching RGB intensity values are grouped together, tiles having between 95% and 99% RGB intensity values are grouped together, and so forth. Note that the clustered groups of tiles need only share similar or same RGB intensity values and other factors such as tile size, tile shape, the image it came from, or the tile's location in the image are not considered, according to some embodiments.

At block 706, one or more groups are identified that have tiles with 100% matching RGB intensity values. In some embodiments, each clustered group of tiles is checked to determine if the tiles within the group each have a 100% content match. For each group that does have tiles with a 100% content match, method 700 proceeds to block 708 to remove duplicate tiles with those groups. For each group that has tiles that do not have a 100% content match, method 700 proceeds to block 710 to determine if the groups have tiles with closely matched content.

At block 708, any groups of tiles that are determined to have a 100% content match have one or more of the tiles removed for being duplicative. According to some embodiments, the duplicative nature of the tiles refers only to the RGB intensity values of the pixels within the tiles, not to any other tile features. Any number of tiles within a particular group may be removed so long as at least one tile from the group remains.

Removing a tile does not remove all traces of the tile, as its existence is still indexed in some fashion in order to later recreate an image that includes the removed tile. Thus, in accordance with some embodiments, a stored data structure includes a tile list of all tiles that have been removed. The data structure may include the removed tiles indexed by one or more certain features, such as by the tile's image ID, the tile's location within the image, or any other such features. Furthermore, any removed tiles may be linked in some way to the remaining tile from its clustered group, so that the matching content from the removed tile can be accessed from the remaining tile that is eventually stored. As an example, there may be a clustered group of ten tiles that are numbered 1-10 for ease of discussion. If all of the tiles in this group are determined to have a 100% content match (e.g., all tiles have pixels with the same RGB intensity values), then tile 1 may remain while tiles 2-10 are removed. The stored data structure is updated to include information about each of removed tiles 2-10, such as their image ID, location within the image, and that they share a link with tile 1. In this way, if an attempt is made later to access the content of tile 5, it will not be found in storage (since it was removed), but the data structure can be accessed to determine that tile 5 is linked with tile 1, and thus the content from tile 1 is accessed instead. Since tile 1 includes identical content (e.g., RGB intensity values) to tile 5, accessing the content of tile 1 is no different than accessing the content of tile 5. Once duplicate tiles have been removed from each group that includes tiles having a 100% content match, method 700 continues to block 710 to determine if any other groups of tiles have closely matched content.

At block 710, one or more groups of tiles are identified that have closely matched content, but not perfectly matched content (e.g., above a threshold % content match). For example, if any clustered groups of tiles are identified that have content matching of at least 70%, then method 700 proceeds to block 712 to break the tiles of those groups into smaller tiles. According to some embodiments, content matching of tiles within a group refers to the number of pixels between tiles that have the same RGB intensity values. For example, a content match of 70% refers to 70% of the pixels within a tile having the same RGB intensity values as 70% of the pixels from another tile within the group. The threshold % may be adjusted depending on how fine the tiling process is desired to be for each of the images. A very low threshold percentage results in an image being broken into many more small tiles while a large threshold percentage results in fewer tiles being used across the image. If there are no remaining groups having tiles that are above the threshold content match percentage, then method 700 ends.

At block 712, the tiles from the groups that are determined to have closely matching content (e.g., content matches above a threshold %) are broken into smaller tiles. According to an embodiment, the smaller tiles can be clustered again based on content similarity in an attempt to form new clusters of tiles that now have a 100% content match. The tiles may be broken into a predetermined number of smaller tiles. For example, each tile may be broken in half, into fourths, etc. In some embodiments, tiles may only be broken if they are above a threshold size, such that any tiles smaller than the threshold size will not be further broken into smaller tiles. In one example, the threshold tile size is 32×32 pixels, although any threshold size may be chosen based on how finely tiles are to be identified within an image.

According to some embodiments, a new tile structure is formed for each of the smaller tiles, such as the tile structure described above with reference to FIG. 6. As such, the original tile and tile structure no longer exists, and instead has been replaced with two or more smaller tiles, each with its own tile structure to indicate the features of the corresponding smaller tile. After the tiles have been broken into smaller tiles, method 700 proceeds back to block 704 where clusters are formed again using the smaller tiles based on content similarity. According to some embodiments, the analysis described in blocks 706 and 710 is then performed again on the newly formed smaller tiles. The process repeats itself until there are no more tiles that have a close enough content similarity (e.g., all remaining tiles are below the threshold content match %).

Figure 8:
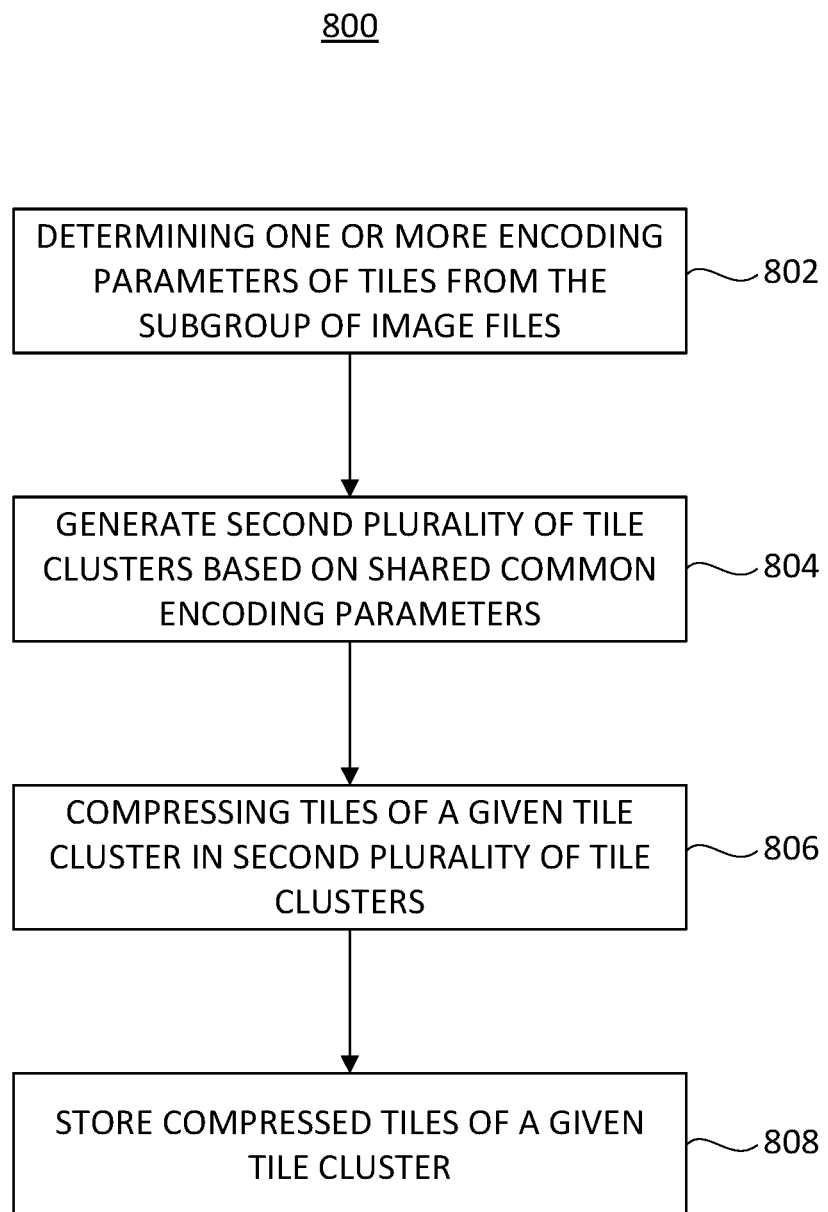
FIG. 8 is a flow diagram of a process for clustering tiles based on encoding scheme and compressing the clustered tiles into one or more saved files, in accordance with some embodiments of the present disclosure.

FIG. 8 illustrates an example flowchart providing further operations of blocks 510, 512, and 514 (also referred to herein as method 800) from method 500, according to an embodiment. The operations, functions, or actions described in the respective blocks of example method 800 may be stored as computer-executable instructions in a non-transitory computer-readable medium, such as a memory and/or a data storage of a computing system. As will be further appreciated in light of this disclosure, for this and other processes and methods disclosed herein, the functions performed in method 800 may be implemented in a differing order. Additionally, or alternatively, two or more operations may be performed at the same time or otherwise in an overlapping contemporaneous fashion.

At block 802, one or more encoding parameters are determined from the tiles within the subgroup of files. In some embodiments, encoding parameters can be determined for tiles of any images that are either stored or actively being received. The encoding parameters may include any parameters that provide quantitative measures for certain image features. Examples encoding parameters include transparency values, color depth values, or contrast values. Different tiles from the same image may include different encoding parameters depending on the pixel content within the tiles. In some embodiments, the encoding parameters of a given tile are stored as tile metadata or as a part of the tile's metadata.

At block 804, the remaining tiles (e.g., after duplicates have been removed) are clustered again to form a second plurality of tile clusters based on one or more shared encoding parameters. In some embodiments, the shared encoding parameters for tiles that are clustered together are not identical, but rather within some threshold percentage of one another. Any number of different encoding parameters may be shared across tiles within a given cluster. In some examples, only a single encoding parameter is shared across tiles within a cluster. Various clustering algorithms may be used to provide a lowest number of total tile clusters based on common encoding parameters.

According to some embodiments, transparency values of tiles are used to cluster tiles together that have either the same or similar transparency values. For example, in situations where transparency is provided on a scale from 0-100, a tile having a transparency value of 40 may be clustered with other tiles having transparency values within ±5 of 40. According to some embodiments, color depth values of tiles are used to cluster tiles together that have either the same or similar color depth. This, for example, may be used to cluster grayscale tiles separately from tiles in the RGB color space.

At block 806, tiles within a given clustered group based on shared encoding parameters are compressed using a suitable image compression algorithm that best suits the corresponding shared encoding parameters, according to an embodiment. Tiles may be compressed using any of a number of known compression algorithms, from which one is selected based on the shared one or more encoding parameters between the tiles. For example, if the tiles share a high degree of transparency effects, then PNG compression may be selected as it provides more efficient compression for such transparency effects. The tiles of a given clustered group may be compressed into a single file or across multiple files.

At block 808, the compressed one or more files from block 806 are stored in memory. The compressed files may be organized in an indexed fashion such that they can be easily identified during reconstruction of an image comprised of tiles from across one or more of the compressed files. The compressed one or more files may be stored in a cloud server, or similar device, that can be accessed from any number of different computing devices across the Internet or other network. By grouping the tiles and compressing them together based on the most efficient compression algorithm, less storage space is required for storing the tile data. Each file includes compressed tile data from any number of tiles across any number of images.

Figure 9:
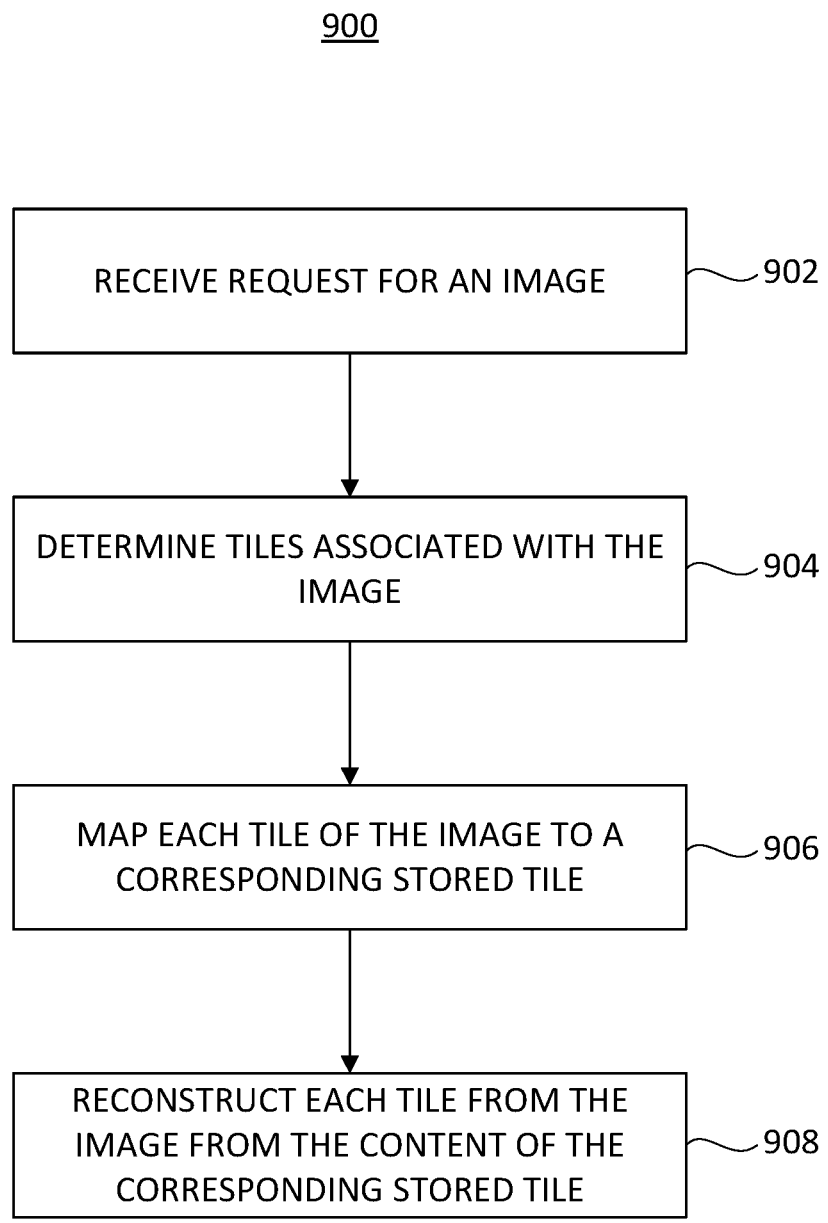
FIG. 9 is a flow diagram of a process for reconstructing an image using stored tiles, in accordance with some embodiments of the present disclosure.

FIG. 9 illustrates an example method 900 of recreating an image from the various stored image tiles using, for example, image reconstruction module 224, according to an embodiment. The operations, functions, or actions described in the respective blocks of example method 900 may be stored as computer-executable instructions in a non-transitory computer-readable medium, such as a memory and/or a data storage of a computing system. As will be further appreciated in light of this disclosure, for this and other processes and methods disclosed herein, the functions performed in method 900 may be implemented in a differing order. Additionally, or alternatively, two or more operations may be performed at the same time or otherwise in an overlapping contemporaneous fashion.

At block 902, a request is received for an image that has its content stored in memory across various tiles. The request may be received via a website that is attempting to download the image from a web server or cloud server. For example, a user accesses a website on a mobile device or a desktop personal computer, and the website calls for certain images to be loaded. The requested image is an image that has been previously uploaded and broken down into various tiles, such that the tiles are either stored in memory or part of a data structure list of removed tiles.

At block 904, all tiles associated with the requested image are determined. All tiles from the image share the same image ID that matches the image ID of the requested image. Accordingly, the tile metadata can be used to determine which of the tiles include the matching image ID of the requested image. One or more of the tiles associated with the image may have been removed and are thus not directly stored in memory. Thus, in accordance with some embodiments, any of the tiles associated with the requested image can be found either as stored tiles or from within the stored tile list of removed tiles. Recall that the tile list may be stored as a data structure that includes distinguishing features about the listed tiles, including the image ID associated with each of the tiles.

At block 906, a mapping procedure takes place to map each tile of the image to a corresponding stored tile in order to load the tile content for each tile. In some embodiments, the mapping involves identifying both stored tiles from the image and tiles that are not stored but rather listed in the stored data structure indicating that the tile was removed for having duplicative content. For each tile found in the tile list, a mapping is instead made to a stored tile that has the same content as the listed tile. Recall that each tile within the stored tile list is linked to a corresponding stored tile that has the same RGB content. Accordingly, the mapping procedure identifies stored tiles to use for recreating the tiles of the image, even if one or more of the stored tiles are not the same tiles from the image.

At block 908, the image is reconstructed using the tile content from the mapped tiles in storage. The reconstruction process is akin to forming a paint-by-numbers picture where the content of the image tiles is either directly loaded from that same tile in storage or is loaded from another stored tile that includes the correct image content. For example, an image is being reconstructed that has a tile that bounds a content region of all dark green pixels. In some embodiments, this same tile was previously compressed and stored in memory, and thus this tile would be retrieved from memory and the content of the stored tile (e.g., dark green pixels) would be used to effectively fill in the corresponding content region in the image. In some other embodiments, the tile from the image was removed for being duplicative and is thus not found directly in the memory. Instead, the stored tile list is accessed to find the tile which links to another tile from memory that also includes the same content (e.g., dark green pixels). The content from this other linked tile would then be used to effectively fill in the corresponding content region in the image. This process repeats for all of the tiles of the requested image, and further repeats for each and every requested image.

Unless specifically stated otherwise, it may be appreciated that terms such as "processing," "computing," "calculating,"

"determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

Further Example Embodiments

The following examples pertain to further embodiments, from which numerous permutations and configurations will be apparent.

Example 1 is a method for efficiently storing a set of image files. The method includes receiving a plurality of images, the plurality including at least a first image and a second image; for each of the first and second images, generating a first plurality of tiles, wherein each tile of the first plurality of tiles of a corresponding image includes pixels that are within a threshold color intensity of one another; generating a first plurality of tile clusters, wherein each tile cluster of the first plurality of tile clusters includes tiles from one or both of the first image and the second image; for each tile cluster of the first plurality of tile clusters, removing any duplicate tiles from the corresponding tile cluster, wherein pixels of the duplicate tiles share a same color intensity as another tile in the corresponding tile cluster, and wherein remaining tiles after the removing constitute a second plurality of tiles; generating a second plurality of tile clusters, wherein each tile cluster of the second plurality of tile clusters includes one or more tiles from the second plurality of tiles, the one or more tiles sharing one or more same encoding parameters; compressing the one or more tiles of a given tile cluster of the second plurality of tile clusters, thereby providing compressed one or more tiles; and storing the compressed one or more tiles of the given tile cluster of the second plurality of tile clusters as a file.

Example 2 includes the subject matter of Example 1, wherein generating the first plurality of tiles comprises identifying a plurality of seed pixels within the corresponding image, and forming a given tile of the first plurality of tiles by identifying other pixels around a given seed pixel that are within the threshold color intensity of the given seed pixel.

Example 3 includes the subject matter of Example 2, wherein identifying the plurality of seed pixels comprises randomly assigning the seed pixels within the corresponding image.

Example 4 includes the subject matter of any one of Examples 1-3, further comprising forming a subgroup of images of the plurality of images, wherein each tile cluster of the first plurality of tile clusters includes one or more tiles from any of the images within the subgroup of images.

Example 5 includes the subject matter of any one of Examples 1-4, further comprising breaking at least two tiles within a given tile cluster of the first plurality of tile clusters into a plurality of smaller tiles.

Example 6 includes the subject matter of Example 5, wherein the breaking occurs for a first tile and a second tile in response to a threshold number of pixels between the first tile and the second tile having a same color intensity.

Example 7 includes the subject matter of any one of Examples 1-6, wherein generating the second plurality of tile clusters comprises determining one or more encoding parameters for each tile of the second plurality of tiles based on metadata associated with each tile of the second plurality of tiles.

Example 8 includes the subject matter of Example 7, wherein the one or more encoding parameters comprises a transparency value.

Example 9 includes the subject matter of Example 7 or 8, wherein the compressing comprises compressing the one or more tiles using an image compression algorithm that is selected based on the shared one or more encoding parameters of the one or more tiles.

Example 10 includes the subject matter of any one of Examples 1-9, further comprising reconstructing a first image, wherein the reconstructing comprises determining a third plurality of tiles associated with the first image file; mapping each of the third plurality of tiles to a corresponding tile of the stored one or more tiles; and reconstructing the first image using the corresponding tiles of the stored one or more tiles.

Example 11 is a system configured to efficiently store a set of image files. The system includes at least one processor, a tile generation module, a content clustering module, and a tile compression module. The tile generation module is executable by the at least one processor and is configured to for each of at least a first image and a second image, generate a first plurality of tiles, wherein each tile of the first plurality of tiles of a corresponding image includes pixels that are within a threshold color intensity of one another. The content clustering module is executable by the at least one processor and is configured to generate a first plurality of tile clusters, wherein each tile cluster of the first plurality of tile clusters includes one or more tiles from one or both of the first image and the second image, and for each tile cluster of the first plurality of tile clusters, remove any duplicate tiles from a corresponding tile cluster, wherein pixels of the duplicate tiles share a same color intensity as another tile in the corresponding tile cluster, and wherein remaining tiles after removing any duplicate tiles constitute a second plurality of tiles. The tile compression module is executable by the at least one processor and is configured to generate a second plurality of tile clusters, wherein each tile cluster of the second plurality of tile clusters includes one or more tiles from the second plurality of tiles sharing one or more same encoding parameters, compress the one or more tiles of a given tile cluster of the second plurality of tile clusters, thereby providing compressed one or more tiles, and store the compressed one or more tiles of the given tile cluster of the second plurality of tile clusters as a file.

Example 12 includes the subject matter of Example 11, wherein the tile generation module is further configured to identify a plurality of seed pixels within the corresponding image, and form a given tile of the first plurality of tiles by identifying other pixels around a given seed pixel that are within the threshold color intensity of the given seed pixel.

Example 13 includes the subject matter of Example 12, wherein the plurality of seed pixels are randomly assigned within the corresponding image.

Example 14 includes the subject matter of any one of Examples 11-13, wherein the content clustering module is further configured to form a subgroup of images of the plurality of images, wherein each tile cluster of the first plurality of tile clusters includes one or more tiles from any of the images within the subgroup of images.

Example 15 includes the subject matter of any one of Examples 11-14, wherein the content clustering module is further configured to break at least two tiles within a given tile cluster of the first plurality of tile clusters into a plurality of smaller tiles.

Example 16 includes the subject matter of Example 15, wherein the breaking occurs for a first tile and a second tile in response to a threshold number of pixels between the first tile and the second tile having a same color intensity.

Example 17 includes the subject matter of any one of Examples 11-16, wherein the tile compression module is further configured to determine one or more encoding parameters for each tile of the second plurality of tiles based on metadata associated with each tile of the second plurality of tiles.

Example 18 includes the subject matter of Example 17, wherein the one or more encoding parameters comprises a transparency value.

Example 19 includes the subject matter of Example 17 or 18, wherein the tile compression module is further configured to compress the one or more tiles using an image compression algorithm that is selected based on shared one or more encoding parameters of the one or more tiles.

Example 20 includes the subject matter of any one of Examples 11-19, further comprising an image reconstruction module, executable by the at least one processor, and configured to determine a third plurality of tiles associated with the first image; map each of the third plurality of tiles to a corresponding tile of the stored one or more tiles; and reconstruct the first image using the corresponding tiles of the stored one or more tiles.

Example 21 is a computer program product including one or more non-transitory machine-readable mediums having instructions encoded thereon that when executed by at least one processor cause a process to be carried out for efficiently storing a set of image files. The process includes receiving a plurality of images, the plurality including at least a first image and a second image; for each of the first and second images, generating a first plurality of tiles, wherein each tile of the first plurality of tiles of a corresponding image includes pixels that are within a threshold color intensity of one another; generating a first plurality of tile clusters, wherein each tile cluster of the first plurality of tile clusters includes tiles from one or both of the first image and the second image; for each tile cluster of the first plurality of tile clusters, removing any duplicate tiles from the corresponding tile cluster, wherein pixels of the duplicate tiles share a same color intensity as another tile in the corresponding tile cluster, and wherein remaining tiles after the removing constitute a second plurality of tiles; generating a second plurality of tile clusters, wherein each tile cluster of the second plurality of tile clusters includes one or more tiles from the second plurality of tiles, the one or more tiles sharing one or more same encoding parameters; compressing the one or more tiles of a given tile cluster of the second plurality of tile clusters, thereby providing compressed one or more tiles; and storing the compressed one or more tiles of the given tile cluster of the second plurality of tile clusters as a file.

Example 22 includes the subject matter of Example 21, wherein generating the first plurality of tiles comprises identifying a plurality of seed pixels within the corresponding image, and forming a given tile of the first plurality of tiles by identifying other pixels around a given seed pixel that are within the threshold color intensity of the given seed pixel.

Example 23 includes the subject matter of Example 22, wherein identifying the plurality of seed pixels comprises randomly assigning the seed pixels within the corresponding image.

Example 24 includes the subject matter of any one of Examples 21-23, wherein the process further comprises forming a subgroup of images of the plurality of images, wherein each tile cluster of the first plurality of tile clusters includes one or more tiles from any of the images within the subgroup of images.

Example 25 includes the subject matter of any one of Examples 21-24, wherein the process further comprises breaking at least two tiles within a given tile cluster of the first plurality of tile clusters into a plurality of smaller tiles.

Example 26 includes the subject matter of Example 25, wherein the breaking occurs for a first tile and a second tile in response to a threshold number of pixels between the first tile and the second tile having a same color intensity.

Example 27 includes the subject matter of any one of Examples 21-26, wherein generating the second plurality of tile clusters comprises determining one or more encoding parameters for each tile of the second plurality of tiles based on metadata associated with each tile of the second plurality of tiles.

Example 28 includes the subject matter of Example 27, wherein the one or more encoding parameters comprises a transparency value.

Example 29 includes the subject matter of Example 27 or 28, wherein the compressing comprises compressing the one or more tiles using an image compression algorithm that is selected based on shared one or more encoding parameters of the one or more tiles.

Example 30 includes the subject matter of any one of Examples 21-29, wherein the process further comprises reconstructing the first image, wherein the reconstructing comprises determining a third plurality of tiles associated with the first image; mapping each of the third plurality of tiles to a corresponding tile of the stored one or more tiles; and reconstructing the first image using the corresponding tiles of the stored one or more tiles.

Numerous specific details have been set forth herein to provide a thorough understanding of the embodiments. It will be appreciated, however, that the embodiments may be practiced without these specific details. In other instances, well known operations, components and circuits have not been described in detail so as not to obscure the embodiments. It can be further appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

What is claimed is:

1. A method for efficiently storing a set of image files, the method comprising:
generating a first plurality of tiles for a first image, wherein tiles of the first plurality of tiles include pixels that are within a threshold color intensity of one another;
generating a second plurality of tiles for a second image, wherein tiles of the second plurality of tiles include pixels that are within the threshold color intensity of one another;

generating a first tile cluster that includes at least one tile from the first image and at least one tile from the second image;
removing a duplicate tile from the first tile cluster, wherein pixels of the duplicate tile share a same color intensity as another tile in the first tile cluster, and wherein remaining tiles after removing the duplicate tile constitute a filtered first tile cluster;
generating a second tile cluster that includes tiles from the filtered first tile cluster that share a common encoding parameter; and
compressing one or more tiles of the second tile cluster, thereby providing one or more compressed tiles.

2. The method of claim 1, wherein the common encoding parameter is selected from a group consisting of a transparency value, a color depth value, and a contrast value.

3. The method of claim 1, wherein the filtered first tile cluster includes tiles from the first image and the second image.

4. The method of claim 1, further comprising storing the compressed one or more tiles of the second tile cluster as a file.

5. The method of claim 1, wherein the compressed one or more files of the second tile cluster are compressed using an image compression algorithm that is selected based on the common encoding parameter.

6. The method of claim 1, wherein generating a particular tile of the first plurality of tiles comprises:
identifying a seed pixel that is within the first image and that has a seed pixel color intensity; and
generating the particular tile by identifying additional pixels that are adjacent to the seed pixel and that have a neighboring pixel color intensity that is within the threshold color intensity of the seed pixel color intensity.

7. The method of claim 1, wherein generating a particular tile of the first plurality of tiles comprises:
randomly assigning a seed pixel within the first image, the seed pixel having a seed pixel color intensity; and
generating the particular tile by identifying additional pixels that are adjacent to the seed pixel and that have a neighboring pixel color intensity that is within the threshold color intensity of the seed pixel color intensity.

8. A system configured to efficiently store an image file, the system comprising:
at least one processor;
a tile generation module, executable by the at least one processor, and configured to:
generate a first plurality of tiles for a first image, wherein tiles of the first plurality of tiles include pixels that are within a threshold color intensity of one another, and
generate a second plurality of tiles for a second image, wherein tiles of the second plurality of tiles include pixels that are within the threshold color intensity of one another;
a content clustering module, executable by the at least one processor, and configured to:
generate a first tile cluster that includes at least one tile from the first image and at least one tile from the second image, and
remove a duplicate tile from the first tile cluster, wherein pixels of the duplicate tile share a same color intensity as another tile in the first tile cluster, and wherein remaining tiles after removing the duplicate tile constitute a filtered first tile cluster; and a tile compression module, executable by the at least one processor, and configured to:
generate a second tile cluster that includes tiles from the filtered first tile cluster that share a common encoding parameter, and
compress one or more tiles of the second tile cluster, thereby providing one or more compressed tiles.

9. The system of claim 8, wherein the content clustering module is further configured to:
identify a particular tile in the first plurality of tiles having content matching at least a threshold percentage of content included in another tile in the first plurality of tiles; and
break the particular tile into multiple smaller tiles.

10. The system of claim 8, wherein the common encoding parameter is selected from a group consisting of a transparency value, a color depth value, and a contrast value.

11. The system of claim 8, wherein the filtered first tile cluster includes tiles from the first image and the second image.

12. The system of claim 8, wherein the tile compression module is further configured to store the compressed one or more tiles of the filtered first tile cluster as a file.

13. The system of claim 8, wherein the compressed one or more files of the filtered first tile cluster are compressed using an image compression algorithm that is selected based on the common encoding parameter.

14. The system of claim 8, wherein generating a particular tile of the first plurality of tiles comprises:
identifying a seed pixel that is within the first image and that has a seed pixel color intensity; and
generating the particular tile by identifying additional pixels that are adjacent to the seed pixel and that have a neighboring pixel color intensity that is within the threshold color intensity of the seed pixel color intensity.

15. The system of claim 8, wherein generating a particular tile of the first plurality of tiles comprises:
randomly assigning a seed pixel within the first image, the seed pixel having a seed pixel color intensity; and
generating the particular tile by identifying additional pixels that are adjacent to the seed pixel and that have a neighboring pixel color intensity that is within the threshold color intensity of the seed pixel color intensity.

16. A computer program product including one or more non-transitory machine-readable mediums having instructions encoded thereon that, when executed by at least one processor, cause a process for efficiently storing a set of image files to be carried out, the process comprising:
generating a first plurality of tiles for a first image, wherein each tile of the first plurality of tiles includes pixels that are within a threshold color intensity of one another;
generating a second plurality of tiles for a second image, wherein each tile of the second plurality of tiles includes pixels that are within the threshold color intensity of one another;
generating a first tile cluster that includes at least one tile from the first image and at least one tile from the second image;
removing a duplicate tile from the first tile cluster, wherein pixels of the duplicate tile share a same color intensity as another tile in the first tile cluster, and wherein remaining tiles after removing the duplicate tile constitute a filtered first tile cluster; and compressing one or more tiles of the filtered first tile cluster, thereby providing one or more compressed tiles.

17. The computer program product of claim 16, wherein:
the process further comprises generating a second tile cluster that includes tiles from the filtered first tile cluster that share a common encoding parameter; and
the one or more tiles of the filtered first tile cluster that are compressed are also included in the second tile cluster.

18. The computer program product of claim 16, wherein the process further comprises:
identifying a particular tile in the first plurality of tiles having content matching at least a threshold percentage of content included in another tile in the first plurality of tiles; and
breaking the particular tile into multiple smaller tiles.

19. The computer program product of claim 16, wherein generating a particular tile of the first plurality of tiles comprises:

identifying a seed pixel that is within the first image and that has a seed pixel color intensity; and
generating the particular tile by identifying additional pixels that are adjacent to the seed pixel and that have a neighboring pixel color intensity that is within the threshold color intensity of the seed pixel color intensity.

20. The computer program product of claim 16, wherein:
the process further comprises generating a second tile cluster that includes tiles from the filtered first tile cluster that share a common encoding parameter;
the common encoding parameter is selected from a group consisting of a transparency value, a color depth value, and a contrast value; and
the one or more tiles of the filtered first tile cluster that are compressed are also included in the second tile cluster.

* * * * *